United States Patent
Mignot et al.

(10) Patent No.: US 9,466,563 B2
(45) Date of Patent: Oct. 11, 2016

(54) INTERCONNECT STRUCTURE FOR AN INTEGRATED CIRCUIT AND METHOD OF FABRICATING AN INTERCONNECT STRUCTURE

(71) Applicants: STMicroelectronics, Inc., Coppell, TX (US); International Business Machines Corporation, Armonk, NY (US)

(72) Inventors: Yann Mignot, Slingerlands, NY (US); Terry Spooner, Clifton Park, NY (US); James John Kelly, Schenectady, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/557,111

(22) Filed: Dec. 1, 2014

(65) Prior Publication Data

US 2016/0155701 A1    Jun. 2, 2016

(51) Int. Cl.
| | |
|---|---|
| H01L 21/44 | (2006.01) |
| H01L 23/522 | (2006.01) |
| H01L 23/528 | (2006.01) |
| H01L 23/532 | (2006.01) |
| H01L 21/768 | (2006.01) |
| H01L 21/311 | (2006.01) |
| H01L 21/288 | (2006.01) |

(52) U.S. Cl.
CPC ......... *H01L 23/5226* (2013.01); *H01L 21/288* (2013.01); *H01L 21/31111* (2013.01); *H01L 21/76802* (2013.01); *H01L 21/76843* (2013.01); *H01L 21/76874* (2013.01); *H01L 21/76879* (2013.01); *H01L 21/76897* (2013.01); *H01L 23/528* (2013.01); *H01L 23/53209* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 6,294,835 B1* | 9/2001 | Dalal | H01L 21/76801 257/748 |
| 8,461,684 B2 | 6/2013 | Gordon et al. | |
| 2009/0152732 A1* | 6/2009 | Nomura | H01L 21/7682 257/773 |
| 2009/0283907 A1* | 11/2009 | Goswami | H01L 21/7681 257/751 |
| 2012/0161320 A1 | 6/2012 | Akolkar et al. | |
| 2013/0320545 A1 | 12/2013 | Yang et al. | |
| 2013/0328208 A1* | 12/2013 | Holmes | H01L 21/76883 257/774 |

OTHER PUBLICATIONS

Koike J., et al: "Self-Forming Diffusion Barrier Layer in Cu—Mn Alloy Metallization," App. Phys. Let. 87 (2005) (3 pages).

* cited by examiner

*Primary Examiner* — Sonya D McCall Shepard
(74) *Attorney, Agent, or Firm* — Gardere Wynne Sewell LLP

(57) ABSTRACT

An integrated circuit includes first and second metallization levels. The first metallization level includes a first metal routing path. The second metallization level includes a dielectric layer having a via opening formed therein extending vertically through the dielectric layer to reach a top surface of the first metal routing path. A metal plug is deposited at a bottom of the via opening in direct contact with the first metal routing path. A remaining open area of the via opening is filled with a metal material to define a second metal routing path. The metal plug is formed of cobalt or an alloy including cobalt, and has an aspect ratio of greater than 0.3.

18 Claims, 11 Drawing Sheets

INTERCONNECT STRUCTURE FOR AN INTEGRATED CIRCUIT AND METHOD OF FABRICATING AN INTERCONNECT STRUCTURE

TECHNICAL FIELD

The present invention relates to the fabrication of integrated circuits and, more particularly, to a process for fabricating an interconnect structure.

BACKGROUND

Semiconductor devices are formed with circuit components on and/or in a substrate layer. The substrate layer may, for example, be a bulk semiconductor substrate or silicon on insulator substrate (SOI). The fabrication of the circuits is referred in the art as a front end of line (FEOL) process. After the FEOL process is completed, the fabrication of the device is finished by forming a network of signal and power paths to connect to the circuit components. This is referred in the art as a back end of line (BEOL) line process.

Routing of the paths in the BEOL process requires the formation of multiple levels (or layers) of metallization over the substrate layer that includes the circuits formed during the FEOL process. The metallization includes metal vias which extend perpendicular to a top surface of the substrate layer and metal lines which extend parallel to the top surface of the substrate layer. It is common to use copper (Cu) as the metal material for the vias and lines, although it is known in the art to use other metal materials as well. The metallization includes an insulating dielectric material at leach level, with the vias and lines being surrounded by the insulating dielectric material.

As semiconductor devices become smaller and more complex, there is a corresponding increase in the complexity of the BEOL metallization including a requirement for increasingly smaller dimensioned metallization structures. This effect is even more pronounced with respect to vias making connections between levels. It is important in forming the via to maintain the desired via dimensions. This is especially critical at the point where the via makes contact with a metal line of an underlying metallization level.

SUMMARY

In an embodiment, an integrated circuit comprises: a first metallization level including a first metal routing path; and a second metallization level overlying the first metallization level, said second metallization level including: a dielectric layer; a via opening formed in said dielectric layer extending vertically through the dielectric layer to a top surface of the first metal routing path; a metal plug at a bottom of the via opening in direct contact with the first metal routing path which leaves a remaining opening in the via opening; and a metal material which fills the remaining opening to define a second metal routing path; wherein the metal plug is formed of cobalt or an alloy including cobalt; and wherein the metal plug has an aspect ratio of greater than 0.3.

In an embodiment, a method for forming a metallization level over an underlying level which includes a first metal routing path comprises: depositing a dielectric layer above the underlying level; forming a via opening in said dielectric layer which extends vertically through the dielectric layer to expose a top surface of the first metal routing path; depositing a metal plug at a bottom of the via opening in direct contact with the first metal routing path, said deposited metal plug leaving a remaining opening in the via opening; and filling the remaining opening with a metal material to define a second metal routing path; wherein the metal plug is formed of cobalt or an alloy including cobalt; and wherein the metal plug has an aspect ratio of greater than 0.3.

In an embodiment, a width of the metal plug may be between 12-50 nm and a height of the metal plug may be between 10-40 nm. The dimensions of the plug depend of thickness of the dielectric layer, chamfer height and final performance parameters.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-17 showing process steps for fabricating an interconnect structure for an integrated circuit. It will be understood that the illustrations provided do not necessarily show the features drawn to scale.

Figure 1:
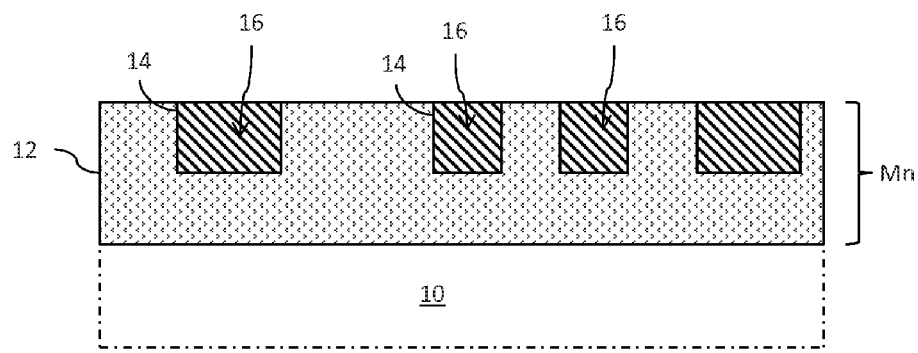
FIGS. 1-17 show process steps in accordance with an embodiment for fabricating an interconnect structure.

FIG. 1 shows a metallization level (Mn) provided over an integrated circuit wafer 10. The wafer 10 would include a substrate layer (for example, of the bulk semiconductor type of silicon on insulator (SOI) type) in and/or on which a plurality of integrated circuits have been fabricated, as well as an overlying pre-metallization dielectric (PMD) layer within which a plurality of metal contacts (for example, made of tungsten (W)) have been formed to make electrical connection to the integrated circuits. The foregoing structure is produced by what is commonly referred to in the art as a front end of line (FEOL) process. The wafer 10 may further include one or more metallization levels formed during what is known to those skilled in the art as a back end of line (BEOL) process. In this context, it will accordingly be understood that the metallization level Mn is not necessarily the first metallization level of the BEOL process (i.e., it need not be M1).

The metallization level Mn comprises a layer 12 of an ultra-low K dielectric material (for example, a dielectric material having a dielectric constant lower than 3.0 so as to reduce the parasitic capacitance between adjacent metal interconnect structures). Exemplary materials that can be used in the interlevel dielectric (ILD) layer 12 include, but are not limited to, a carbon-doped silicon oxide, a fluorine-doped silicon oxide, a hydrogen-enriched silicon oxycarbide (SiCOH), a porous silicon oxide, a porous carbon-doped silicon oxide, a porous SiLK™, a spin-on silicone based polymeric dielectric such as methyl silsesquioxane (MSQ) and hydrogen silsesquioxane (HSQ), or a spin-on organic polymeric dielectric. The ILD layer 12 may be formed by CVD, PECVD or spin coating. The layer 12 may have a thickness, for example, of 60-200 nm. Using a Damascene process as well known in the art, a number of openings 14 are formed in the top surface of the layer 12. The openings 14 are then filled with a metal material to define metal routing paths (lines/vias) 16 for the metallization level Mn. The metal material filling openings 14 may, for example, comprise copper (Cu). It will be understood that filling of the openings 14 may result in the deposition of metal material on the top surface of the layer 12. A process such a chemical mechanical planarization (CMP) known to those skilled in the art may be used to remove unwanted metal material and provide a planar top surface for metallization level Mn.

It will be understood that in an alternative embodiment, the level Mn is actually at the pre-metal dielectric (PMD) level of the integrated circuit (i.e., at the end of the FEOL process). In such a case, define metal routing paths 16 for the metallization level Mn comprise contact structures which make electrical contact to the semiconductor substrate (at source/drain regions, for example) of make electrical contact for FEOL fabricated structures above the semiconductor substrate (at the transistor gate terminal, for example). In such a case, the metal material filling openings 14 may, for example, comprise copper or another metal material with the metal routing paths 16 forming contact plug structures as known in the art.

Figure 2:
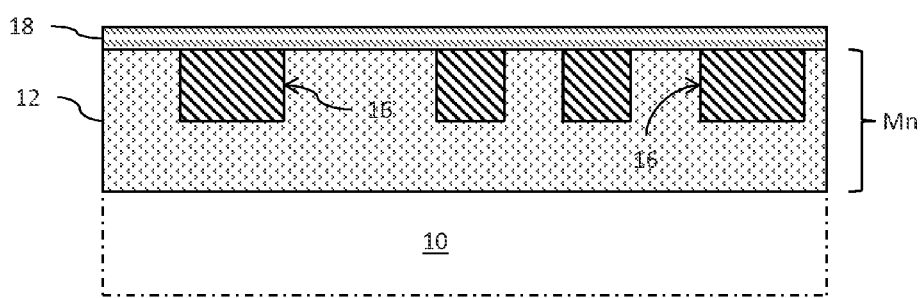

Next, an interface/adhesion layer 18 is deposited on the top surface of the metallization level Mn. The layer 18 may comprise a dielectric material (silicon oxide, silicon nitride, silicon carbide, for example) and have a thickness of 10-30 nm deposited using a conventional deposition process such as, for example, chemical vapor deposition (CVD), plasma enhanced chemical vapor deposition (PECVD) or spin coating. The layer 18 functions to protect the deposited metal that filled openings 14. For example, the layer 18 can serve to prevent air from reacting with the copper metal material (i.e., an oxidation barrier) or serve to prevent subsequently deposited layers from reacting with the copper metal material. The result is shown in FIG. 2.

Figure 3:
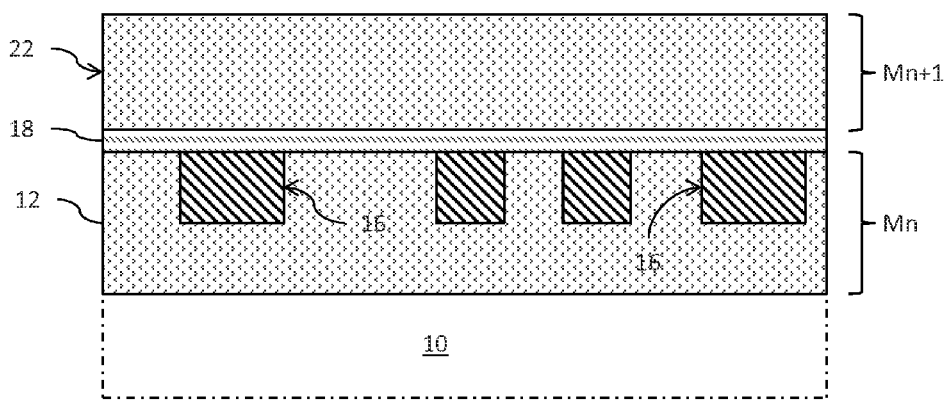

A layer 22 of a dielectric material (such as, for example, a dielectric material having a dielectric constant less than 3 so as to reduce the parasitic capacitances between adjacent metal interconnect structures) is deposited on the top surface of the layer 18. The layer 22 may have a thickness, for example, of 30-1,000 nm, or more particularly 60-200 nm, deposited using a conventional deposition process such as, for example, chemical vapor deposition (CVD), plasma enhanced chemical vapor deposition (PECVD) or spin coating. The layer 22 is provided in association with the formation of a next metallization level (Mn+1). The result is shown in FIG. 3. Exemplary materials that can be used in the layer 22 include, but are not limited to, a carbon-doped silicon oxide, a fluorine-doped silicon oxide, a hydrogen-enriched silicon oxycarbide (SiCOH), a porous silicon oxide, a porous carbon-doped silicon oxide, a porous SiLK™, a spin-on silicone based polymeric dielectric such as methyl silsesquioxane (MSQ) and hydrogen silsesquioxane (HSQ), or a spin-on organic polymeric dielectric. Thus, in an embodiment, the layer 12 and 22 may be made of the same material.

Figure 4:
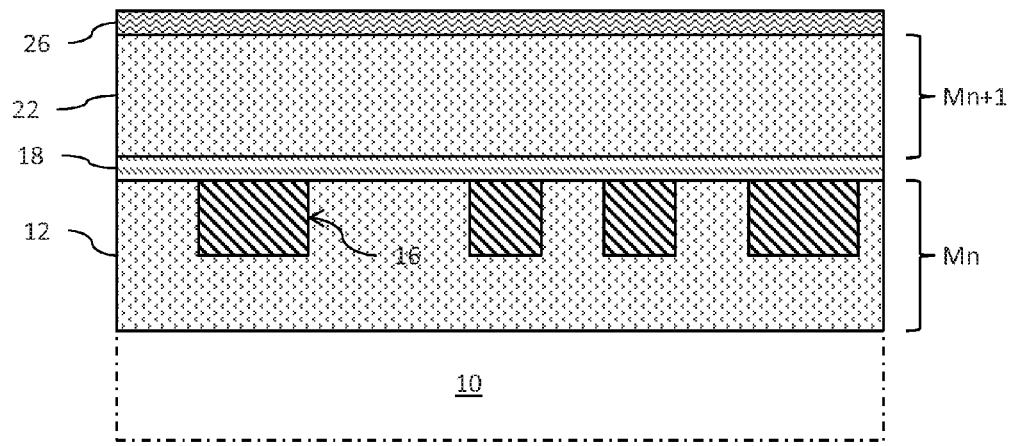

Next, a hard mask layer 26 is deposited on the top surface of the layer 22 for the metallization level Mn+1. The hard mask layer 26 may, for example, comprise a dielectric material (such as an ultra-low K dielectric material with a K value higher than the K value of the layer 22) for use as an adhesion purpose or for its wet strippability properties. Alternatively, the hard mask layer 26 may comprise a layer with different carbon (C) concentration referred to in the art as a graded layer. It will be understood that the layer 26 is an optional layer whose use depends on the material chosen for a subsequently deposited layer used in the fabrication process. The layer 26 may have a thickness, for example, of about 5 nm, and preferably less than about 10 nm deposited using a conventional deposition process such as, for example, chemical vapor deposition (CVD), plasma enhanced chemical vapor deposition (PECVD) or spin coating. The result is shown in FIG. 4.

Figure 5:
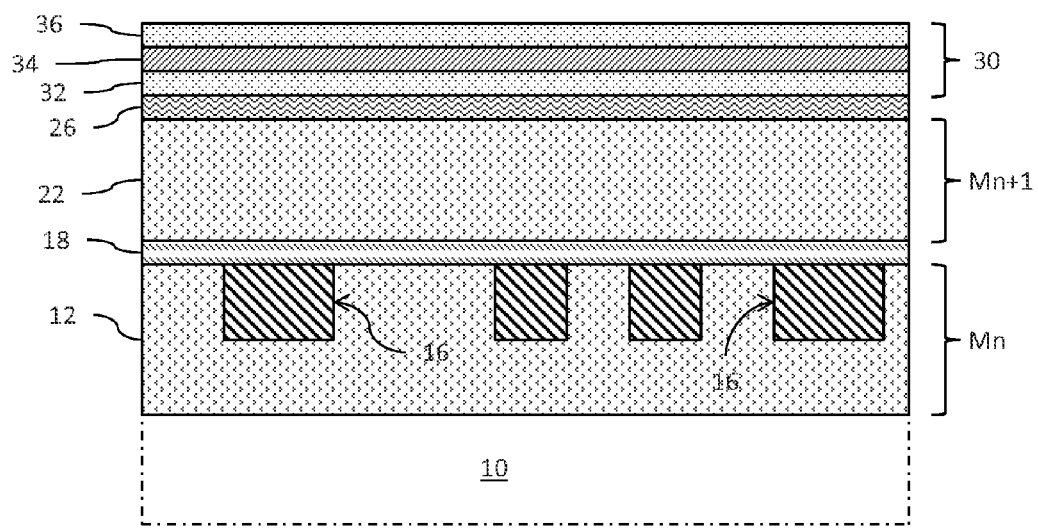

A multi-layer mask 30 is then deposited as shown in FIG. 5. In an embodiment, the mask 30 may comprise a first layer 32 formed of a nitride material, a second layer 34 formed of a hard metal material (such as titanium nitride (TiN)), and a third layer 36 formed of an oxide or nitride material. If an embodiment with a nitride first layer 32 is used, the barrier 26 is optional and can be omitted from the process. In an alternative embodiment, the mask 30 may comprise a first layer 32 formed of an oxide material (such as, for example, TEOS), a second layer 34 formed of a metal material (such as titanium nitride (TiN)), and a third layer 36 formed of an oxide or nitride material. If an embodiment with an oxide first layer 32 is used, the barrier 26 is not necessarily optional and is preferably present. The first layer 32 may, for example, have a thickness of 10-30 nm for the nitride material and 10-40 nm for the oxide material, and be deposited using a chemical vapor deposition (CVD) or plasma enhanced chemical vapor deposition (PECVD) process (with, for example, tetraethylorthosilicate (TEOS) and oxygen as precursors). The second layer 34 may, for example, have a thickness of 10-40 nm deposited using a chemical vapor deposition (CVD) or plasma enhanced chemical vapor deposition (PECVD) process. The third layer 36 may, for example, have a thickness of 15-40 nm deposited using a chemical vapor deposition (CVD) or plasma enhanced chemical vapor deposition (PECVD) process (with, for example, tetraethylorthosilicate (TEOS) and oxygen as precursors). The choice of material for the third layer 36 may depend on the specific patterning technique used with respect to defining a mask pattern in the mask 30. The material for the third layer 36 may comprise TEOS or a spacer oxide (from a sidewall image transfer (SIT) patterning technique as known in the art).

Figure 6:
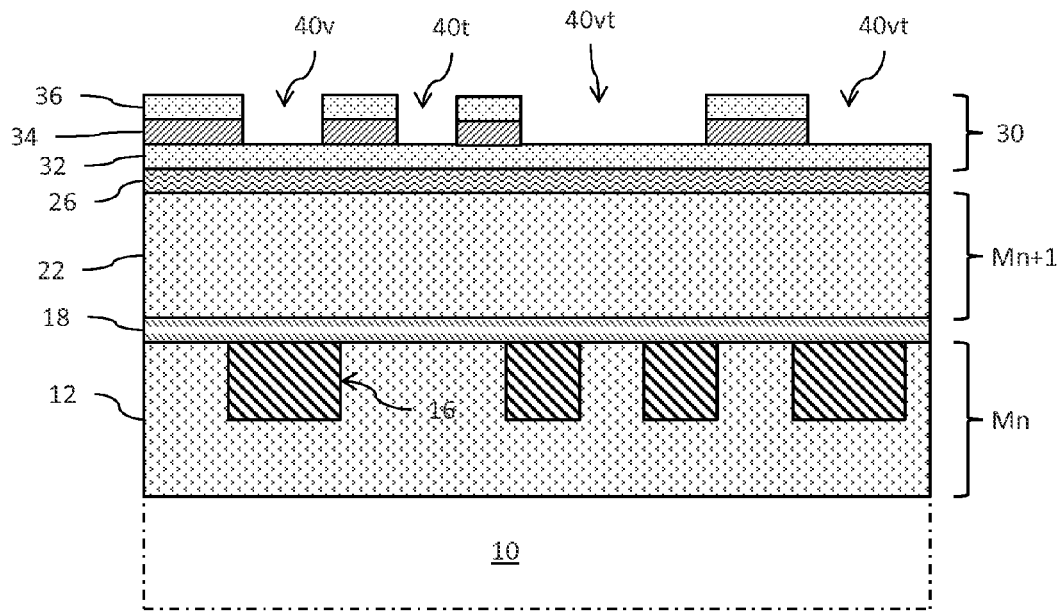

Reference is now made to FIG. 6. Using any suitable lithographic technique known to those skilled in the art (including, for example, litho-etch-litho-etch-litho-etch (LELELE) or sidewall image transfer (SIT)), a plurality of openings 40 are formed in the multi-layer mask 30. Although the openings 40 are illustrated as stopping at the first layer 32, it will be understood that this is by example illustration only and that in actuality the openings may penetrate slightly into, but not through, the first layer 32. The openings 40 include first openings 40v that are associated with the formation of vias in the metallization level Mn+1, second openings 40t that are associated with the formation of trenches in the metallization level Mn+1 and third openings 40vt associated with the formation of a combined via and trench in the metallization level Mn+1. In this regard, those skilled in the art will understand that the difference between the openings 40v and 40vt is merely a matter of orientation with respect to a same type of openings wherein the opening 40v is shown in the self-aligned orientation and the opening 40vt is shown in the non-self-aligned orientation. The self-aligned and non-self-aligned directions relative to a given opening substantially orthogonal to each other.

Figure 7:
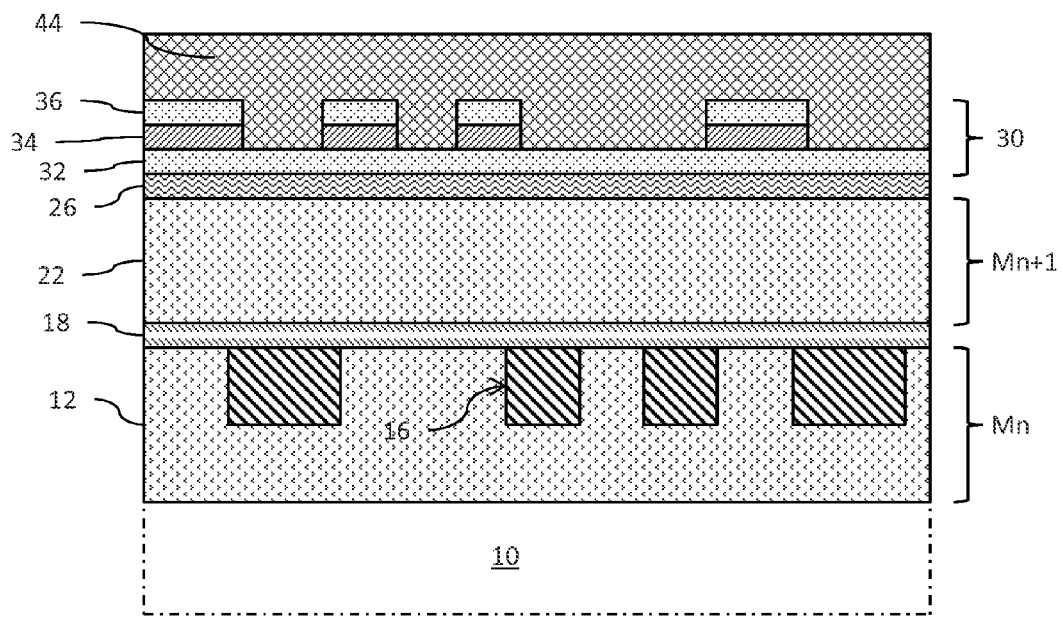

An organic planarization layer (OPL) 44 is then deposited on top of the multi-layer mask 30 using a spin-on coating process. This layer 44 fills the openings 40v, 40t and 40vt, and may have a thickness of 100-300 nm. A polymer with low viscosity, or other material exhibiting a self-planarizing characteristic, may be used for the layer 44. The result is shown in FIG. 7.

Next, patterning for via openings is performed. This patterning can be accomplished in a number of ways.

Figure 8A:
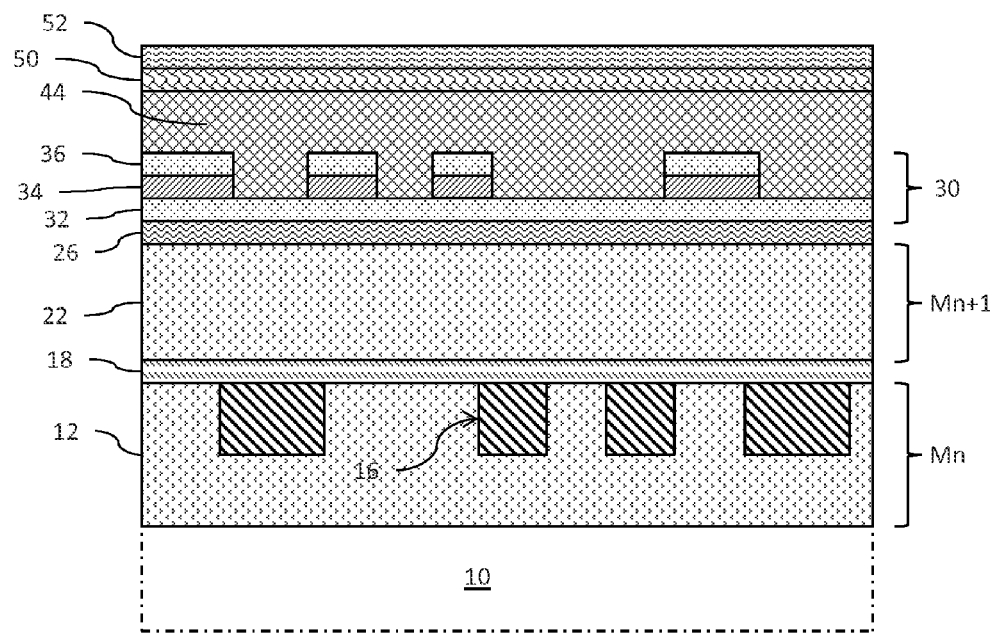
Figure 8B:
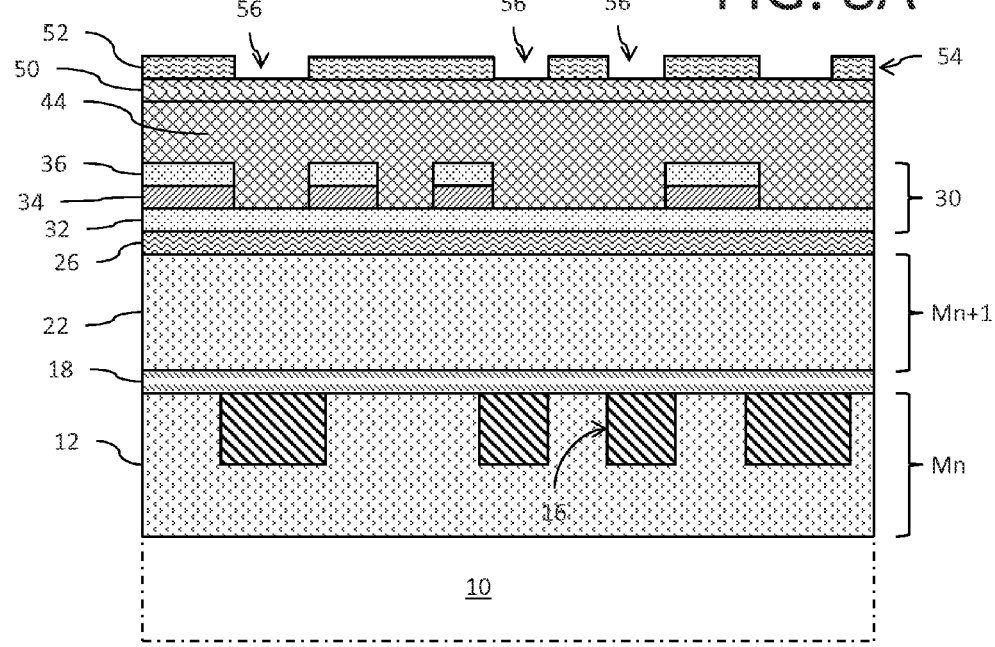

One embodiment for patterning for via openings is shown in FIGS. 8A-8B. An anti-reflective coating layer 50 is deposited on the top surface of the organic planarization layer (OPL) 44. The layer 50 may, for example, comprise silicon containing materials such as the SiARC coating as known to those skilled in the art having a thickness of 12-35 nm. The layer 50 may, for example, be deposited using a spin-on coating process. A resist layer 52 is then deposited on top of the layer 52. A lithographic process as well known to those skilled in the art is then use to pattern the resist layer 52 to define a mask 54 including a plurality of openings 56 that are associated with the formation of vias in the metallization level Mn+1. In general, the openings 56 are vertically aligned with the openings 40v.

Figure 9A:
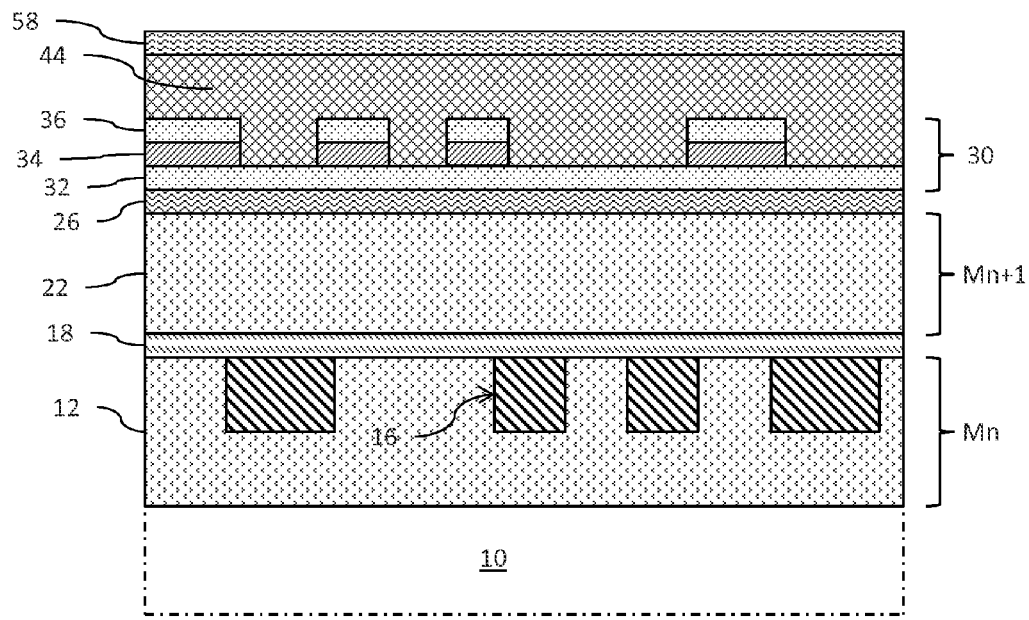
Figure 9B:
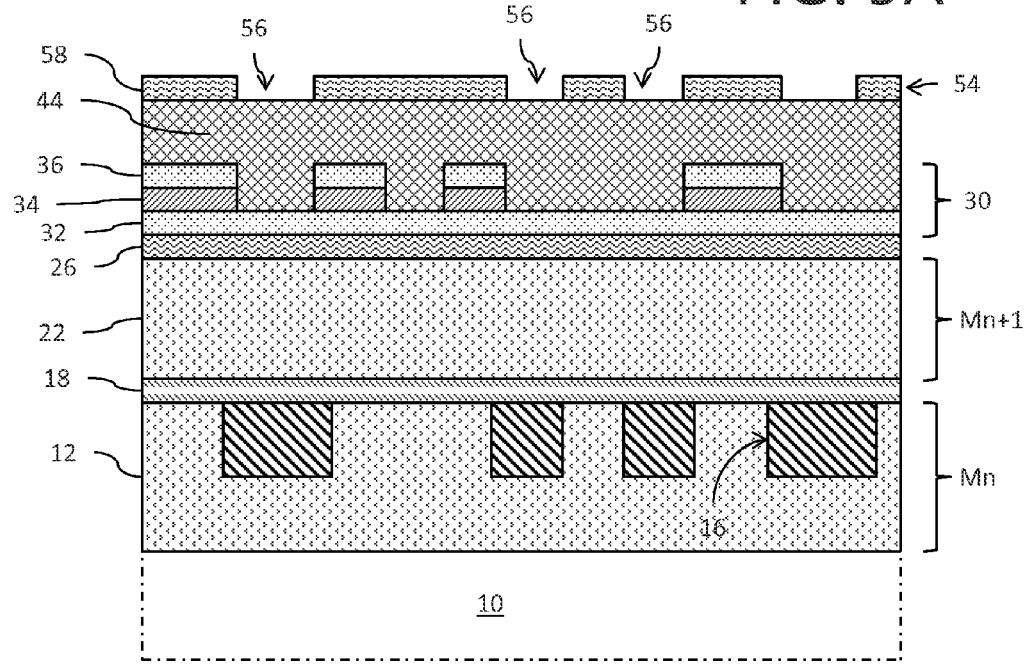

Another embodiment for patterning for via openings is shown in FIGS. 9A-9B. An oxide layer 58 is deposited on the top surface of the organic planarization layer (OPL) 44. The layer 58 may, for example, comprise any suitable low temperature oxide material known to those skilled in the art. The layer 58 may, for example, be deposited using a low temperature CVD or atomic layer deposition (ALD) process with a thickness of 10-30 nm. A lithographic process as well known to those skilled in the art is then use to pattern the layer 58 to define a mask 54 including a plurality of openings 56 that are associated with the formation of vias in the metallization level Mn+1. In general, the openings 56 are vertically aligned with the openings 40v.

Figure 10:
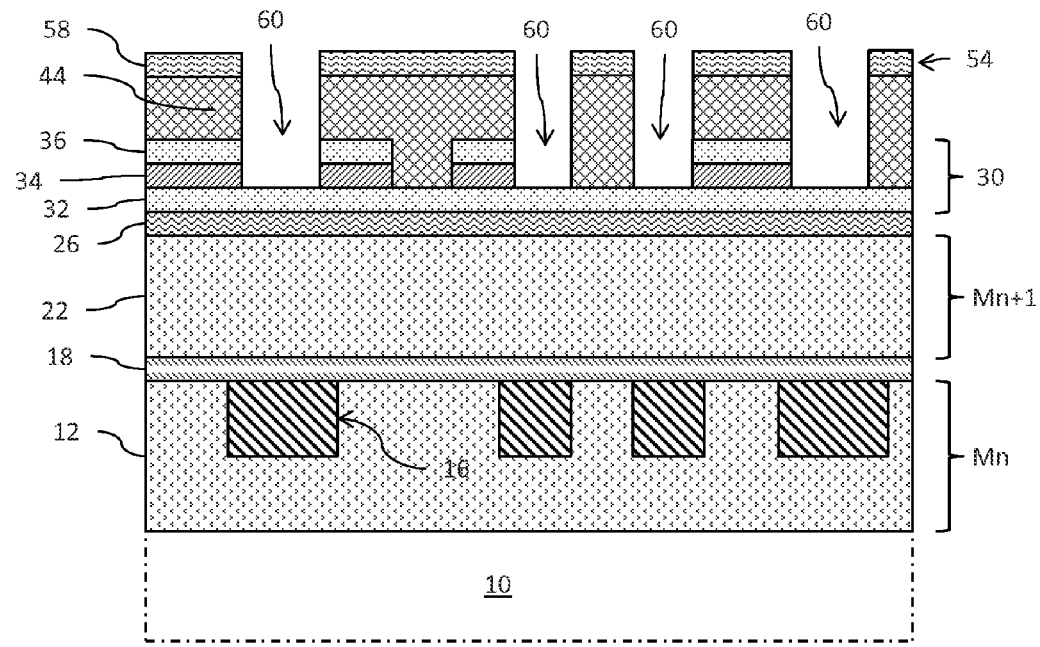

Using the mask 54 as a guide, an etch is performed through the mask openings 56 to form openings 60 where portions of the organic planarization layer (OPL) 44 have been removed extending into the openings 40v. The etch may, for example, comprise a reactive ion etch (RIE) as known to those skilled in the art. The result is shown in FIG. 10.

Figure 11:
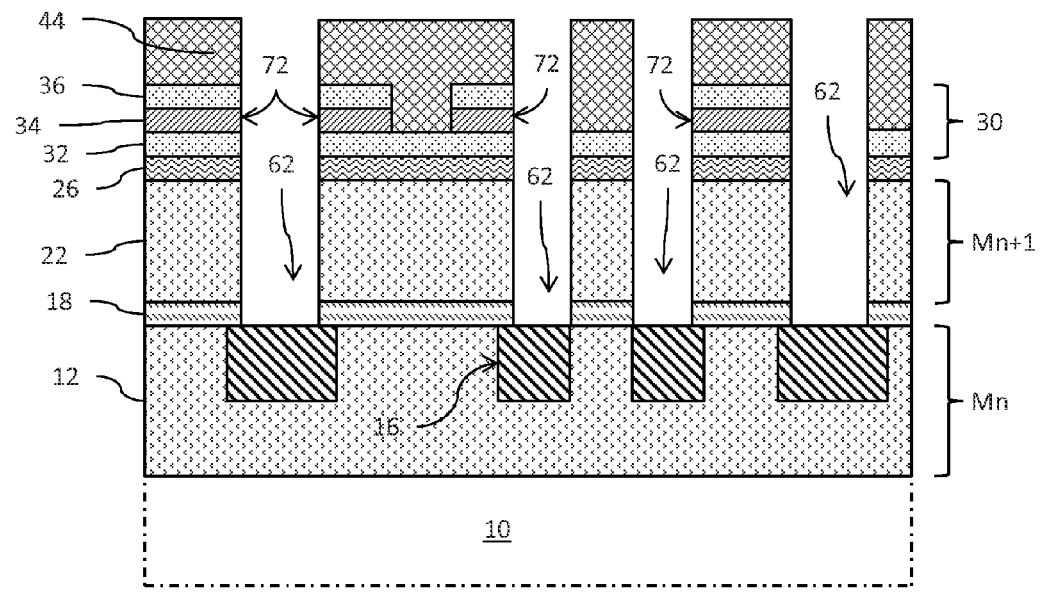

A second etch is performed through the openings 60 to extend openings 62 through the first layer 32, the layer 22 of ultra-low K dielectric material and optional layer 18 which reach the top surface of the metal routing paths (lines/vias) 16 located in the underlying metallization level Mn. The second etch may, for example, comprise a reactive-ion etch (RIE) as known to those skilled in the art. The result is shown in FIG. 11. Although the via openings 62 are illustrated as stopping at the top surface of the metal routing paths (lines/vias) 16, it will be understood that this is by example illustration only and that in actuality the via openings will penetrate slightly into the top surface of the metal routing paths (lines/vias) 16. During this step, it will be noted that the mask layer 54 is removed along with the etching through of the layers 32, 26, 22.

The metal second layer 34 of the mask 30 serves to impede lateral erosion (at reference 72) as a result of the reactive-ion etch for the via openings 62. This is because the TiN metal preferred for layer 34 is selective to oxide RIE and therefore does not etch as quickly as the oxide. The TiN acts to resist increase in via size.

Figure 12:
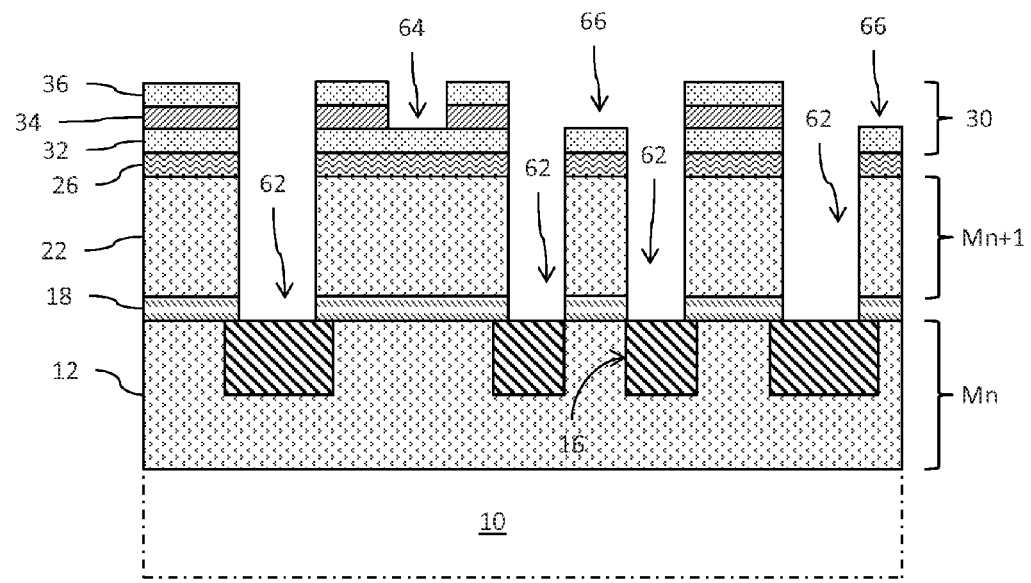

The organic planarization layer (OPL) 44 is then removed using a $CO/CO_2$ or $N_2/H_2$ RIE chemistry process. The result is shown in FIG. 12. It will be noted that this removal forms openings 64 associated with trenches and openings 66 associated with combined via and trench areas (compare to openings 40t and 40vt as described above it being understood by those skilled in the art that the difference between the openings 64 and 66 is merely a matter of orientation with respect to a same type of openings wherein the opening 64 is shown in the self-aligned orientation and the opening 66 is shown in the non-self-aligned orientation). A post etch wet clean process as well known to those skilled in the art is performed to prepare the wafer for further processing.

Figure 13:
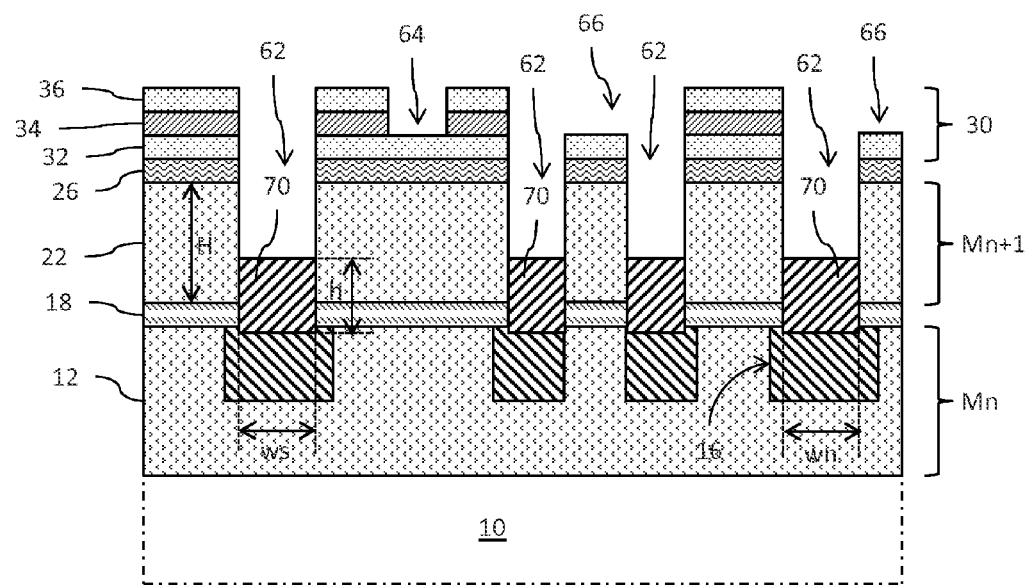

Reference is now made to FIG. 13. A wet electro-less deposition process is then used to deposit a plug 70 at the bottom of each via opening 62. The plug 70 may, for example, comprise a cobalt (Co) material or an alloyed material which includes cobalt and one or more other materials such as nickel (Ni), tungsten (W), phosphorous (P) or boron (B). In this deposition process, the copper (Cu) material of the metal routing paths (lines/vias) 16 located in the underlying metallization level Mn at the bottom of each via opening 62 acts as a catalytic point to initiate the electro-less deposition of the cobalt material in forming the plug 70. Importantly, the presence of the cobalt (or cobalt alloy) plug 70 at the bottom of each via opening serves to set the critical dimension of the via at the point of electrical contact with the metal routing paths (lines/vias) 16 located in the underlying metallization level Mn. It will be noted that because the etch shown in FIG. 11 preferably penetrates into the top surface of the metal routing paths (lines/vias) 16, the plug 70 is illustrated as penetrating into the top surface of the metal routing paths (lines/vias) 16.

The material forming the plug 70 is not conformally deposited but rather aggregates on the copper top surface of metal routing paths (lines/vias) 16 at the bottom of the each via opening 62. The length of the aggregation in the wet electro-less deposition process determines the height 'h' of the plug 70. In an embodiment, the height h is preferably one-third to one-half of the height "H" of the metallization level Mn+1. In this regard, the height h of the plug 70 is preferably greater than the thickness of layer 18 (if present) and extends to a point no greater than one-half the thickness of the layer 22. In an alternative embodiment, the aspect ratio of the plug 70 (i.e., the ratio of the height h to the width 'ws' in the self-aligned direction) is preferably greater than 0.3 and with an aspect ratio range of 0.3-1.0. In an example of an implementation of the process with a critical dimension of 24 nm (half pitch of about 48 nm) the plug 70 has a width ws=15-22 nm and a height h=10-30 nm, and a width 'wn' in the non-self-aligned direction of wn=22-40 nm where the metallization level has a height H=10-30 nm.

It is noted that some prior art documents teach the use of a cobalt conformal liner in a trench structure. The plug 70 is understood to be different from such liner implementations at least because the plug shape does not exhibit a conformal deposition configuration. Additionally, the plug 70 is provided in openings having smaller dimensions than for prior art cobalt trench liner structures.

Figure 14:
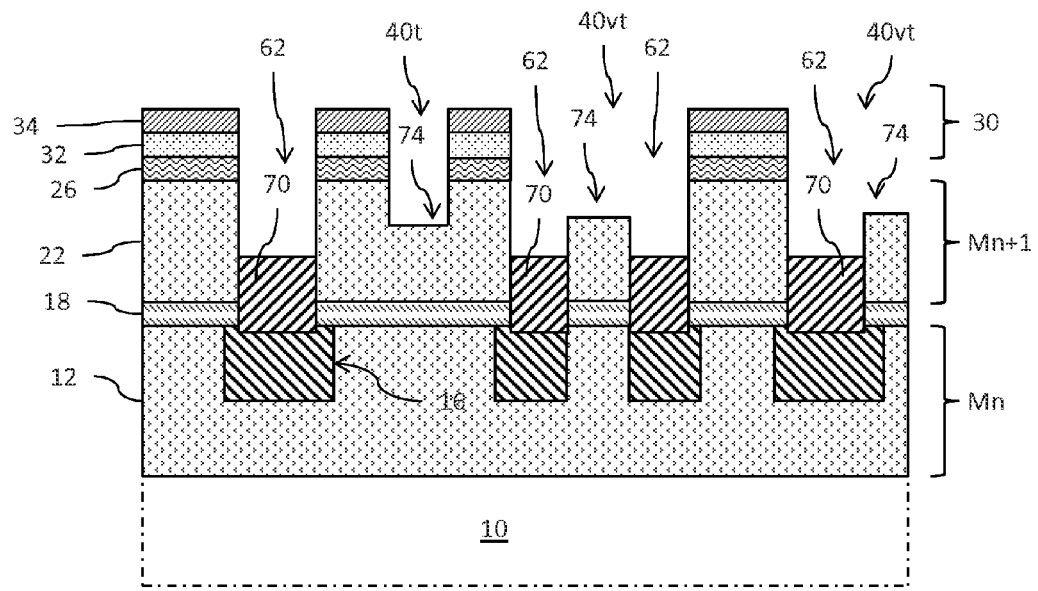

Using the mask 30 as a guide, an etch is performed through the mask openings 40t and 40vt to form trench openings 74. The etch may, for example, comprise a reactive-ion etch (RIE) as known to those skilled in the art. It will be noted that the RIE will completely remove any remaining portions of the third layer 36 of the mask 30. The RIE etch will further remove portions of the layers 26 and 32 which are not covered by the metal second layer 34 of the mask 30. Thus, layers 26 and 32 exposed in the openings 40t and 40vt are removed. Additionally, the RIE penetrates into, but not completely through, the layer 22 of ultra-low K dielectric material and optional layer 18 to define the depth of the trench openings 74 in layer 22. The result is shown in FIG. 14. The plug 70 will block operation of the etch and so the depth of the openings will not increase.

Figure 18A:
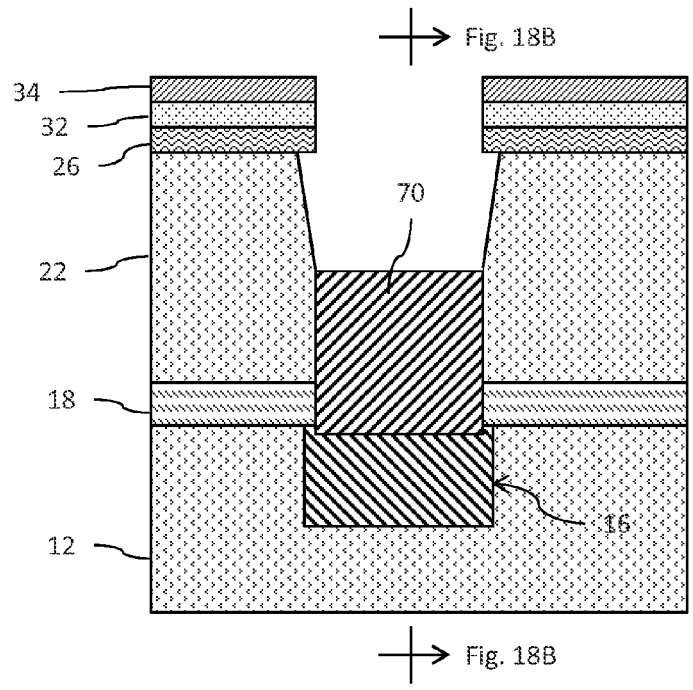
FIGS. 18A-18B show erosion of the via opening above a metal plug in both the self-aligned direction and the non-self-aligned direction.
Figure 18B:
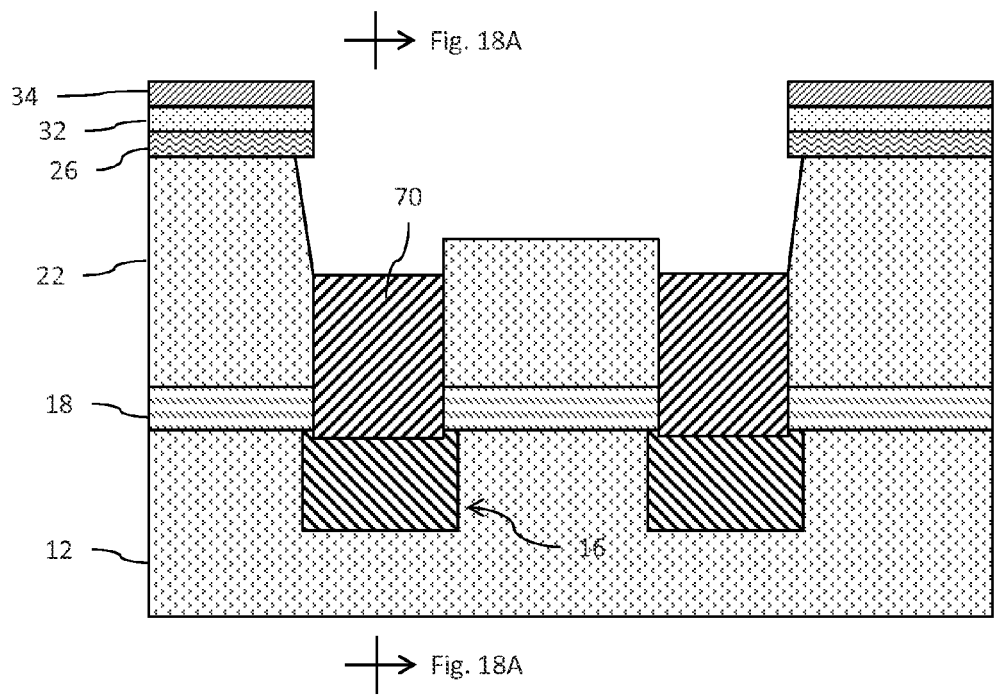

It will be understood that the etch performed in association with FIG. 14 may introduce a lateral spread of the via opening 62 above the location of the plug 70. This lateral spread can be controlled or minimized the use of an anisotropic RIE along with the addition of wall polymerization such $CH_2F_2$ and all other $CHF_x$ species. This is not explicitly shown in FIG. 14, but is shown in FIGS. 18A-18B which illustrate a closer view of a plug 70 and via opening 62 with lateral erosion in the self-aligned direction and non-self-aligned direction, respectively, along the walls of the via opening above the location of the plug 70. Importantly, the presence of the plug 70 protects the bottom of the via opening 62 from being eroded by the etch, and so the dimensions of the via opening at the bottom are well controlled.

Figure 15A:
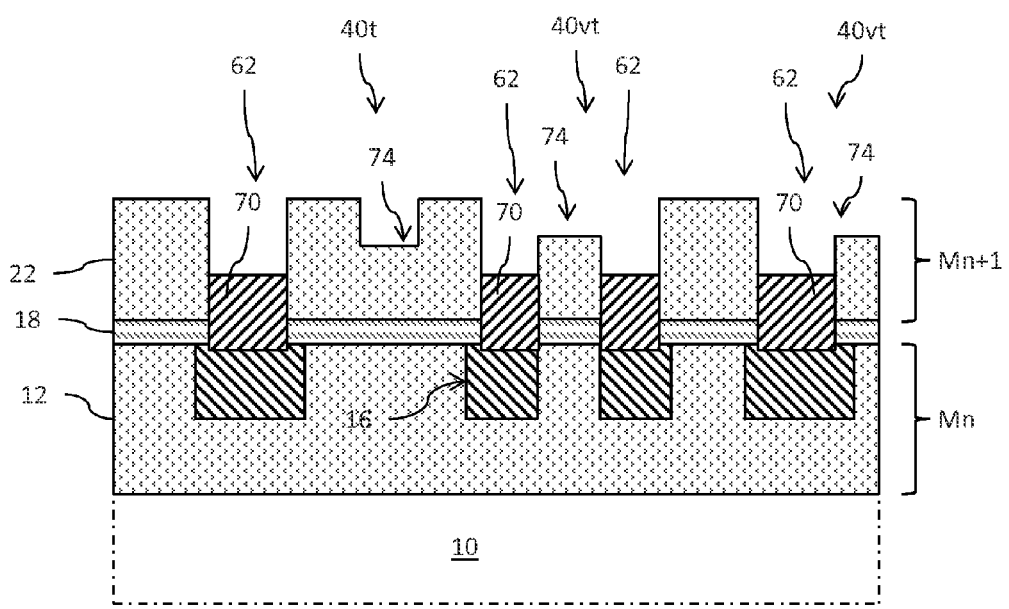

In one option, the remaining portions of the mask 30 are removed. The optional layer 26, if present, may also be removed. A wet process is used to remove the layers 34 and 32. The result is shown in FIG. 15A.

Figure 15B:
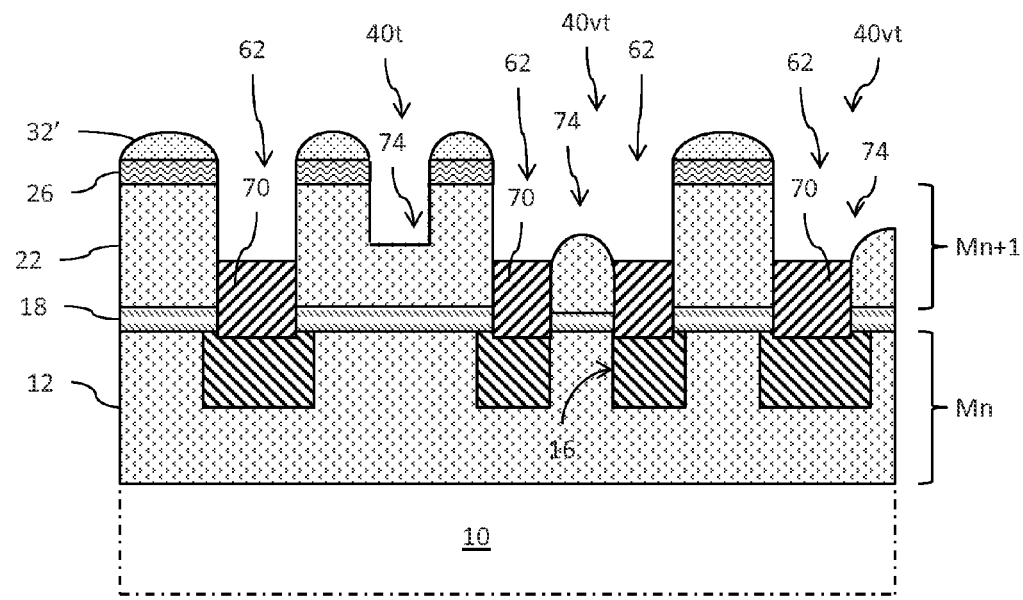

In another option, metal second layer 34 of the mask 30 is removed. A wet process is used for this removal. Additionally, the first layer 32 of the mask is subjected to a top corner rounding (TCR) process as known to those skilled in the art to produce corner rounded structures 32' over the regions of the layer 22 of ultra-low K dielectric material where via openings 62 and trench openings 74 are not located. This process will further slightly deepen the trench openings 74 but will not deepen the openings protected by the plugs 70. The result is shown in FIG. 15B.

Figure 16A:
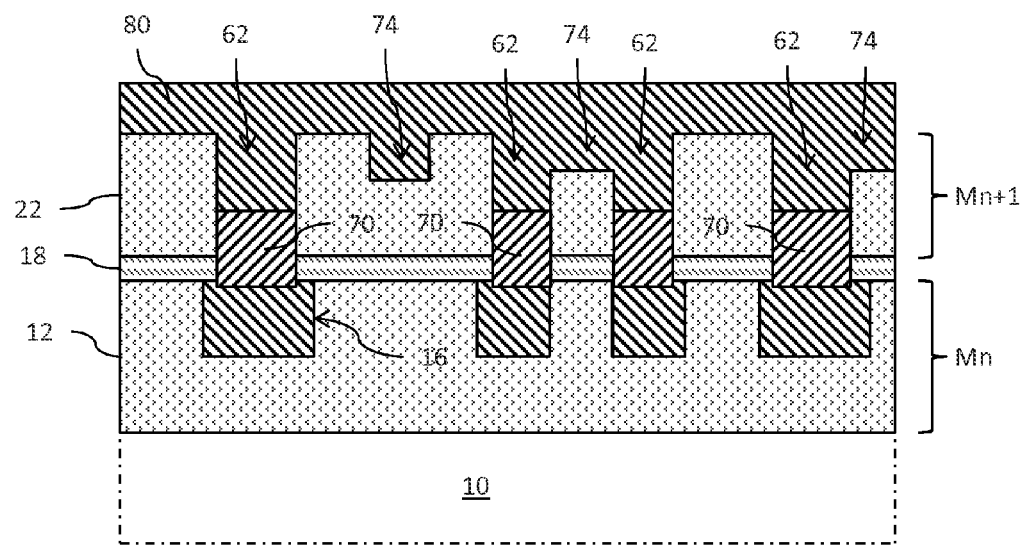
Figure 16B:
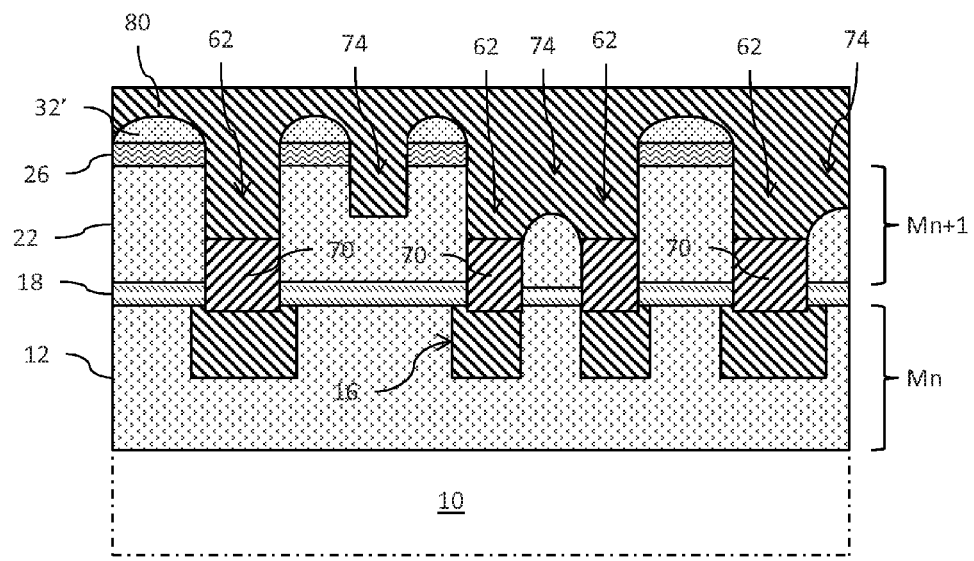

The via openings 62 and trench openings 74 are then filled with a metal material 80. The metal material 80 may, for example, comprise a conformal barrier layer (for example, made of tantalum, tantalum nitride, titanium or titanium nitride with a thickness of 1-5 nm and deposited using a PVD, CVD and/or ALD process), a conformal liner layer (for example, made of tantalum nitride with a thickness of 2 nm and deposited using a PVD process), and a metal fill (for example, made of copper (Cu) and deposited using a physical vapor deposition (PVD) and/or an electroplate fill process). The result is shown in FIGS. 16A and 16B. The barrier and liner are not explicitly illustrated.

Figure 17:
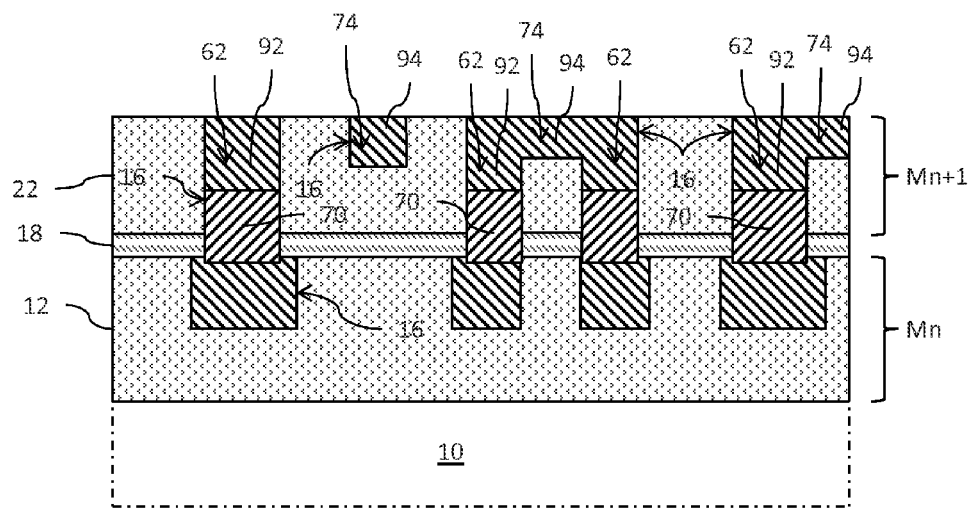

A chemical mechanical planarization (CMP) process is then performed to remove undesired materials from the top of the wafer and complete the definition of metal routing paths 16 for the metallization level Mn+1. The paths 16 include via structures 92 (formed in the via openings 62) and line structures 94 (formed in the trench openings 74). The result is shown in FIG. 17.

The process shown in FIGS. 2-17 may then be repeated as may times a necessary to add additional metallization levels.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit, comprising:
    a first metallization level including a first metal routing path; and
    a second metallization level overlying the first metallization level, said second metallization level including:
        a dielectric layer;
        a via opening formed in said dielectric layer extending vertically through the dielectric layer to a top surface of the first metal routing path, wherein the via opening has a self-aligned direction and a non-self-aligned direction;
        a metal plug at a bottom of the via opening in direct contact with the first metal routing path which leaves a remaining opening in the via opening, wherein a width of the metal plug in the self-aligned direction is less than a width of the metal plug in the non-self-aligned direction; and
        a metal material which fills the remaining opening to define a second metal routing path;
        wherein the metal plug is formed of cobalt or an alloy including cobalt.

2. The circuit of claim 1, wherein the metal plug extends to a maximum height which is less than a height of the dielectric layer through which the via opening extends.

3. The circuit of claim 1, wherein the metal material comprises a conformal liner and a metal fill.

4. The circuit of claim 2, wherein the maximum height of the metal plug is between one-third and one-half of the height of the dielectric layer.

5. The circuit of claim 2, wherein the maximum height is between 10 nm and 30 nm, where a width of the metal plug is between 15 nm and 40 nm.

6. The circuit of claim 5, wherein the width of the metal plug is between 15 nm and 22 nm in the self-aligned direction and between 22 nm and 40 nm in the non-self-aligned direction.

7. The circuit of claim 3, wherein the metal fill comprises copper.

8. The circuit of claim 3, wherein the conformal liner provides a barrier layer.

9. The circuit of claim 3, wherein the conformal liner provides a seed layer.

10. A circuit, comprising:
    a metallization level which includes a first metal routing path;
    a dielectric layer over said metallization level, the dielectric layer including a via opening extending vertically completely through the dielectric layer and aligned with a top surface of the first metal routing path, said via opening having a width and a first height and further having a self-aligned direction and a non-self-aligned direction;
    a metal plug that is not a conformal liner disposed at a bottom of the via opening in direct contact with the top surface of the first metal routing path, said metal plug having a second height less than the first height, wherein a width of the metal plug in the self-aligned direction is less than a width of the metal plug in the non-self-aligned direction;
    wherein the metal plug is formed of cobalt or an alloy including cobalt; and
    a second metal routing path disposed within the via opening in contact with the metal plug;
    wherein the second metal routing path is made of a material different than the metal plug.

11. The circuit of claim 10, wherein the second metal routing path comprises:
    a conformal liner in contact with the metal plug; and
    a metal fill over the conformal liner.

12. The circuit of claim 11, wherein the metal fill comprises copper.

13. The circuit of claim 11, wherein the conformal liner is a barrier layer.

14. The circuit of claim 11, wherein the conformal liner is a seed layer.

15. A circuit, comprising:
- a metallization level which includes a first metal routing path;
- an adhesion layer on said metallization level;
- a dielectric layer on said adhesion layer;
- a via opening extending vertically completely through the dielectric layer and the adhesion layer to a top surface of the first metal routing path, wherein the via opening has a self-aligned direction and a non-self-aligned direction;
- a metal plug disposed at a bottom of the via opening in direct contact with the top surface of the first metal routing path, said metal plug having a height across its width that is greater than a thickness of the adhesion layer but less than a combined thickness of the adhesion layer and dielectric layer, wherein a width of the metal plug in the self-aligned direction is less than a width of the metal plug in the non-self-aligned direction;
- wherein the metal plug is formed of cobalt or an alloy including cobalt; and
- a second metal routing path disposed within the via opening in contact with the metal plug;
- wherein the second metal routing path is made of a material different than the metal plug.

16. The circuit of claim 15, wherein the thickness of the adhesion layer is 10-30 nm and a thickness of the dielectric layer greater than the thickness of the adhesion layer.

17. The circuit of claim 16, wherein the thickness of the dielectric layer is 30-1000 nm.

18. The circuit of claim 16, wherein the thickness of the dielectric layer is 60-200 nm.

* * * * *